(12) United States Patent
Ueda et al.

(10) Patent No.: US 9,236,848 B2
(45) Date of Patent: Jan. 12, 2016

(54) FILTER, DUPLEXER, COMMUNICATION MODULE AND COMMUNICATION DEVICE

(75) Inventors: Masanori Ueda, Tokyo (JP); Takashi Matsuda, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 430 days.

(21) Appl. No.: 13/590,897

(22) Filed: Aug. 21, 2012

(65) Prior Publication Data

US 2012/0313725 A1 Dec. 13, 2012

Related U.S. Application Data

(63) Continuation of application No. PCT/JP2011/053628, filed on Feb. 21, 2011.

(30) Foreign Application Priority Data

Feb. 25, 2010 (JP) ................................. 2010-040653

(51) Int. Cl.
| | |
|---|---|
| *H03H 9/54* | (2006.01) |
| *H03H 9/70* | (2006.01) |
| *H03H 9/00* | (2006.01) |
| *H03H 3/02* | (2006.01) |
| *H03H 9/58* | (2006.01) |

(52) U.S. Cl.
CPC ............... *H03H 9/0095* (2013.01); *H03H 3/02* (2013.01); *H03H 9/585* (2013.01); *H03H 9/587* (2013.01); *H03H 9/706* (2013.01); *H03H 2003/021* (2013.01)

(58) Field of Classification Search
CPC .............. H03H 9/0023; H03H 9/0095; H03H 9/02125; H03H 9/54; H03H 9/582; H03H 9/584; H03H 9/60; H03H 9/706; H03H 3/02; H03H 2003/021; H03H 9/585; H03H 9/587
USPC .................. 333/133, 189, 191, 192; 310/322, 310/323.01, 324, 334, 335
See application file for complete search history.

(56) References Cited

U.S. PATENT DOCUMENTS 6,670,866 B2 * 12/2003 Ella et al. ...................... 333/133
6,720,844 B1 4/2004 Lakin (Continued)

FOREIGN PATENT DOCUMENTS

| JP | 2005-094568 A | 4/2005 |
|---|---|---|
| JP | 2005-130068 A | 5/2005 |

(Continued)

OTHER PUBLICATIONS

C. Billard et al.; "200mm Manufacturing Solution for Coupled Resonator Filters"; IEEE 2009 Proceedings of the European Solid State Device Reasearch Conference, ESSDERC '09, Athens, Sep. 14-18, 2009, pp. 133-136.*

(Continued)

*Primary Examiner* — Barbara Summons
(74) *Attorney, Agent, or Firm* — Chen Yoshimura LLP

(57) ABSTRACT

The filter includes: a primary transducer connected to a primary terminal; a secondary transducer connected to a plurality of secondary terminals; and a coupling transducer for mechanically coupling the primary transducer and the secondary transducer.

14 Claims, 11 Drawing Sheets

(56) References Cited

U.S. PATENT DOCUMENTS

| | | | |
|---|---|---|---|
| 7,003,875 B2 | 2/2006 | Imura et al. | |
| 7,075,214 B2 * | 7/2006 | Inoue et al. | 310/328 |
| 7,173,504 B2 * | 2/2007 | Larson et al. | 333/189 |
| 7,786,826 B2 * | 8/2010 | Thalhammer et al. | 333/189 |
| 8,228,138 B2 * | 7/2012 | Hara et al. | 333/133 |
| 2004/0150293 A1 | 8/2004 | Unterberger | |
| 2005/0090033 A1 | 4/2005 | Imuri et al. | |
| 2005/0093653 A1 | 5/2005 | Larson, III | |
| 2005/0093656 A1 | 5/2005 | Larson, III et al. | |
| 2005/0093659 A1 * | 5/2005 | Larson et al. | 333/191 |
| 2005/0206476 A1 | 9/2005 | Ella et al. | |
| 2006/0232361 A1 * | 10/2006 | Wang et al. | 333/133 |
| 2007/0010227 A1 | 1/2007 | Naniwada | |
| 2008/0048802 A1 * | 2/2008 | Aigner et al. | 333/189 |
| 2009/0256650 A1 * | 10/2009 | Cathelin et al. | 333/189 |
| 2010/0039000 A1 | 2/2010 | Milsom et al. | |

FOREIGN PATENT DOCUMENTS

| | | | |
|---|---|---|---|
| JP | 2005-137002 A | | 5/2005 |
| JP | 2007-510374 A | | 4/2007 |
| JP | 2007-529940 A | | 10/2007 |
| JP | 2008-283425 A | | 11/2008 |
| JP | 2008-543157 A | | 11/2008 |
| WO | WO 2010/079614 | * | 7/2010 |

OTHER PUBLICATIONS

IEEE Xplore abstract for the Billard et al. article "200mm Manufacturing Solution for Coupled Resonator Filters", Sep. 14-18, 2009, one page.*
G.G. Fattinger et al.; "Coupled Bulk Acoustic Wave Resonator Filters: Key Technology for Single-to-Balanced RF Filters"; 2004 IEEE MTT-S International Microwave Symposium Digest, Jun. 6-11, 2004, vol. 2, pp. 927-929.*
K.M. Lakin; "Thin Film BAW Filters For Wide Bandwidth And High Performance Applications"; 2004 IEEE MTT-S International Microwave Symposium Digest, Jun. 6-11, 2004, vol. 2, pp. 923-926.*
Japanese Office Action dated Jun. 20, 2013, in a counterpart Japanese patent application No. 2010-040653.
International Search Report (ISR) issued in PCT/JP2011/053628 mailed in Mar. 2011.
Written Opinion (PCT/ISA/237) issued in PCT/JP2011/053628 mailed in Mar. 2011.
Japanese Office Action dated Sep. 10, 2013, in a counterpart Japanese patent application No. 2010-040653.
The Decision to reject amendments dated Dec. 17, 2013, in a counterpart Japanese patent application No. 2010-040653.

* cited by examiner

FILTER, DUPLEXER, COMMUNICATION MODULE AND COMMUNICATION DEVICE

CROSS-REFERENCE TO RELATED APPLICATION

This application is a continuation of International Application No. PCT/JP2011/053628, filed on Feb. 21, 2011 and is based upon and claims the benefit of priority of the prior Japanese Patent Application No. 2010-040653, filed on Feb. 25, 2010, the entire contents of which are incorporated herein by reference.

FIELD

The disclosure of the present application relates to a filter, a duplexer, a communication module, and a communication device.

BACKGROUND

In recent years, the development has been underway of filter elements for high-frequency communications characterized in allowing only electronic signals in a certain frequency band to pass therethrough, which characteristic being achieved by the combination of a plurality of resonators using surface acoustic waves (SAWs) by using a piezoelectric material or resonators using thickness vibration waves of a piezoelectric film (FBARs). Because filter components utilizing SAW resonators or FBARs are smaller in outer size than other dielectric and ceramics filters and have steep roll-off properties, they are suitable for components of mobile communication devices such as mobile phones whose components need to be small and have a narrow fractional bandwidth. Duplexers are components to which SAW and FBAR ladder filters are applied. Duplexers have been used in wireless devices that have transmission and reception capabilities and transmit and receive signals of different frequencies. In duplexers, unbalanced transmitting filters, and unbalanced input-balanced output receiving filters having an output impedance of 100Ω are required in recent years, so that the output impedance becomes larger than the input impedance.

Patent Document 1 discloses a multimode SAW filter in which unbalanced to balanced conversion and input to output conversion can be implemented. Patent Document 2 discloses an MEMS resonator in which unbalanced to balanced conversion can be implemented.
Patent Document 1: JP 2008-283425 A
Patent Document 2: JP 2005-094568 A However, Patent Documents 1 and 2 do not disclose an FBAR in which unbalanced to balanced conversion can be implemented. The inventors found that with the configurations disclosed in Patent Documents 1 and 2, it is difficult to achieve a high Q filter.

SUMMARY

An example of a filter disclosed in the present application includes: a primary transducer connected to a primary terminal; a secondary transducer connected to a plurality of secondary terminals; and a coupling transducer for mechanically coupling the primary transducer and the secondary transducer.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF EMBODIMENTS

Embodiment 1

1. Configuration of Filter

Figure 1A:
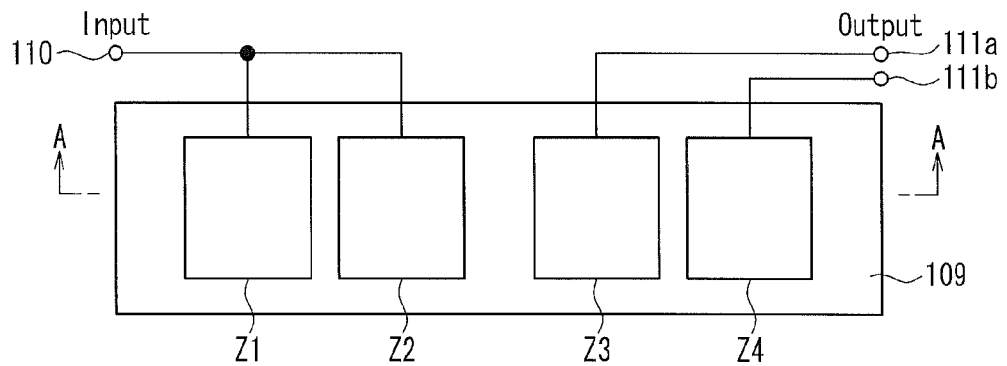
FIG. 1A is a plan view of an example of a balanced filter according to one embodiment.
Figure 1B:
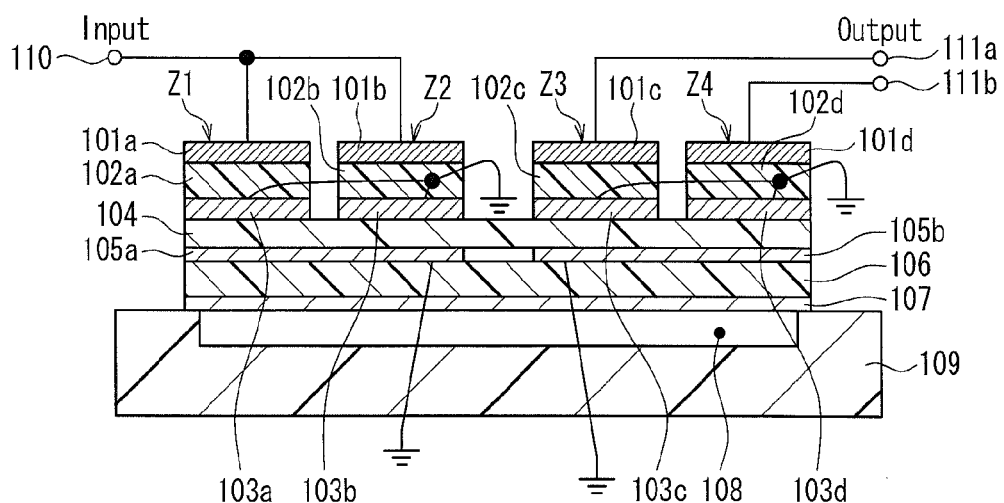
FIG. 1B is a cross-sectional view of the A-A portion in FIG. 1A.
Figure 1C:
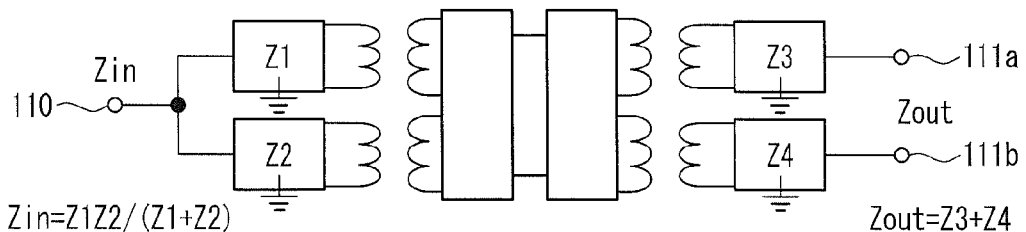
FIG. 1C is an equivalent circuit diagram of the balanced filter shown in FIG. 1A.

FIGS. 1A to 1C are diagrams of an impedance conversion type balanced filter (hereinafter referred to as a balanced filter) for explaining the present embodiment. FIG. 1A is a plan view of the balanced filter, FIG. 1B is a cross-sectional view of the A-A portion in FIG. 1A, and FIG. 1C is an equivalent circuit diagram of the balanced filter shown in FIG. 1A. The basic structure of the balanced filter shown in FIGS. 1A to 1C is a coupled resonator filter (CRF) structure in which transducers having an FBAR structure and an acoustic coupling film are laminated in the thickness direction.

The balanced filter shown in FIGS. 1A to 1C includes input-side upper electrodes 101a and 101b, output-side upper electrodes 101c and 101d, first piezoelectric films 102a to 102d, lower electrodes 103a to 103d, a coupling layer 104, upper electrodes 105a and 105b, a second piezoelectric film 106, a lower electrode 107, a substrate 109, an input terminal 110, a first output terminal 111a, and a second output terminal 111b. The first piezoelectric films 102a to 102d and the second piezoelectric film 106 can be made of, for example, MN. The upper electrodes 101a to 101d, 105a, and 105b and the lower electrodes 103a to 103d and 107 can be made of, for example, ruthenium (Ru), tungsten (W) and the like. The coupling layer 104 is a layer for mechanically coupling an input transducer (described later), an output transducer (described later) and a coupling transducer (described later), and can be made of, for example, silicon oxide (SiO2). The upper electrodes 101a and 101b, the first piezoelectric films 102, and the lower electrodes 103 provide a function as the input transducer (one example of the primary transducer). The upper electrodes 101c and 101d, the first piezoelectric films 102, and the lower electrodes 103 provide a function as the output transducer (one example of the secondary transducer). The second piezoelectric film 106, the upper electrodes 105 and the lower electrode 107 provide a function as the coupling transducer.

In the balanced filter shown in FIGS. 1A to 1C, the input transducer and the output transducer are connected to each other in cascade through the coupling transducer. Two upper electrodes, the upper electrodes 101a and 101b, are connected to the input terminal 110 in parallel. Therefore, by using the individual impedances of the upper electrodes 101a and 101b (Z1, Z2), the impedance of the input terminal 110 (Zin) can be expressed by the following equation, Zin=Z1·Z2/(Z1+Z2) . . . (Eq. 1). On the other hand, on the output side, the output terminal 111a is connected to the upper electrode 101c and the output terminal 111b is connected to the upper electrode 101d. Therefore, by using the individual impedances of the output terminals 111a and 111b (Z3, Z4), the impedance of the combination of the output terminals 111a and 111b (Zout) can be expressed by the following equation, Zout=Z3+Z4 . . . (Eq. 2). Given that the upper electrodes 101a to 101d each have an impedance of 100Ω, the input impedance is 50Ω based on Eq. 1 and the output impedance is 200Ω based on Eq. 2.

Hereinafter, more detailed examples of the impedance conversion type balanced filter will be described.

Example 1

Figure 2A:
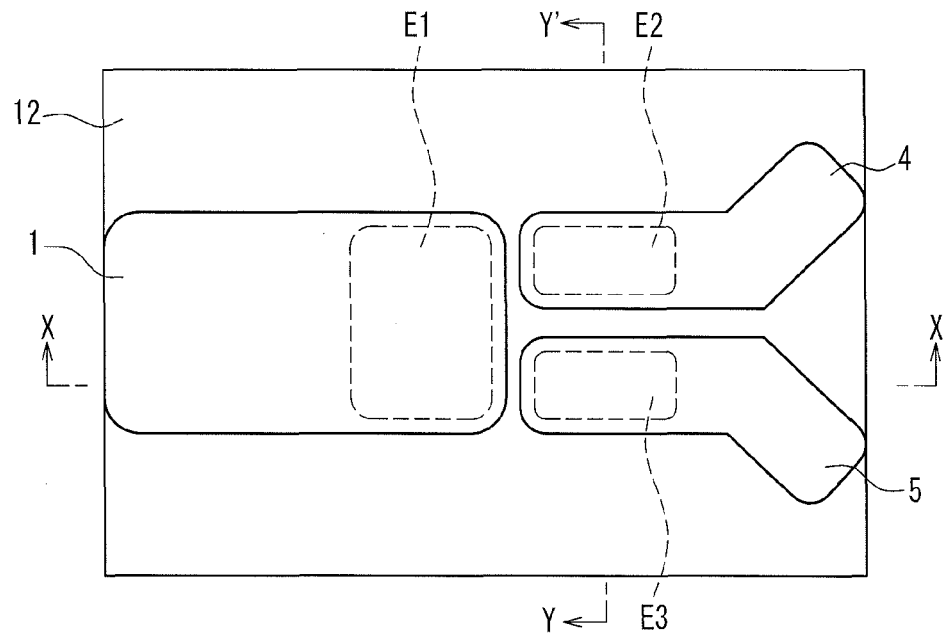
FIG. 2A is a plan view of an example of a balanced filter of Example 1.
Figure 2B:
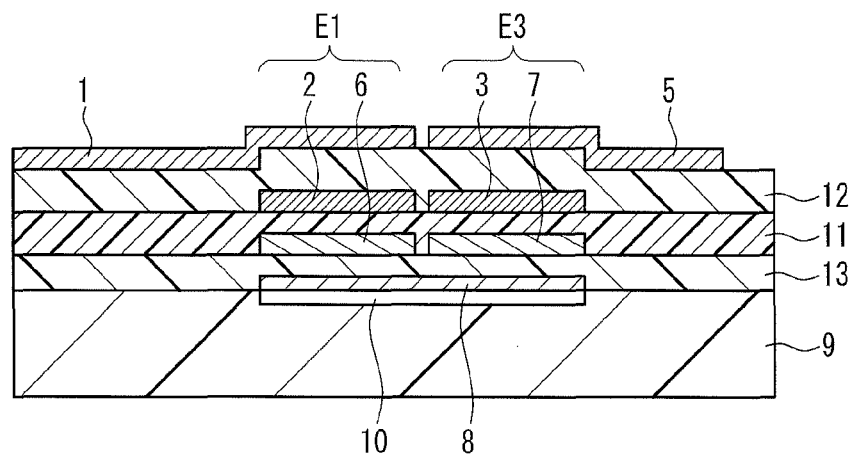
FIG. 2B is a cross-sectional view of the X-X portion in FIG. 2A.
Figure 2C:
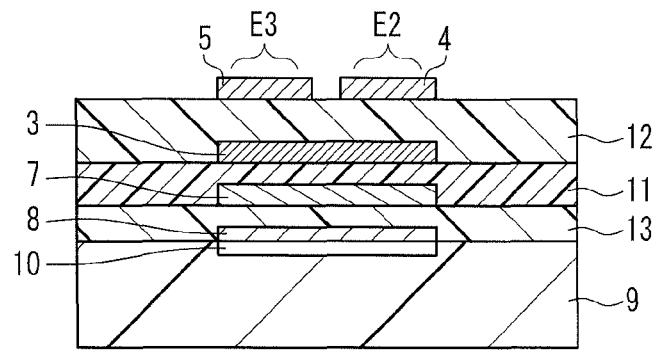
FIG. 2C is a cross-sectional view of the Y-Y portion in FIG. 2A.

FIG. 2A is a plan view of an impedance conversion type balanced filter of Example 1. FIG. 2B is a cross-sectional view of the X-X portion in FIG. 2A, and FIG. 2C is a cross-sectional view of the Y-Y portion in FIG. 2A.

The balanced filter of Example 1 includes upper electrodes 1, 4, 5, 6 and 7, lower electrodes 2, 3, and 8, a substrate 9, an acoustic coupling film 11, a first piezoelectric film 12, and a second piezoelectric film 13. The substrate 9 includes a cavity 10 on the surface facing the lower electrode 8. The cavity 10 is for increasing the excitation efficiency. The lower electrode 8 is formed at the position overlapping the cavity 10 of the substrate 9. The second piezoelectric film 13 is formed on the lower electrode 8 and the substrate 9. The upper electrodes 6 and 7 are formed on the second piezoelectric film 13. The upper electrodes 6 and 7 are aligned on the second piezoelectric film 13 in the plane direction. The acoustic coupling film 11 is formed on the upper electrodes 6 and 7 and the second piezoelectric film 13. The lower electrodes 2 and 3 are formed on the acoustic coupling film 11. The lower electrodes 2 and 3 are aligned on the surface of the acoustic coupling film 11 in the plane direction. The first piezoelectric film 12 is formed on the lower electrodes 2 and 3 and the acoustic coupling film 11. The upper electrodes 1 and 5 are formed on the first piezoelectric film 12. The upper electrodes 1 and 5 are aligned on the surface of the first piezoelectric film 12 in the plane direction. The upper electrode 1 and the lower electrode 2 oppose each other through the first piezoelectric film 12.

The upper electrode 5 and the lower electrode 3 oppose each other through the first piezoelectric film 12. The upper electrode 6 and the lower electrode 8 oppose each other through the second piezoelectric film 13. The upper electrode 7 and the lower electrode 8 oppose each other through the second piezoelectric film 13. It is preferable that the first piezoelectric film 12 and the second piezoelectric film 13 are made of aluminum nitride (AlN), zinc oxide (ZnO) and the like. It is preferable that the upper electrodes 1, 4, and 5, the lower electrodes 2 and 3, the upper electrodes 6 and 7 and the lower electrode 8 are made of high acoustic impedance materials such as ruthenium (Ru), molybdenum (Mo), and tungsten (W).

The acoustic coupling film 11 is a film for mechanically coupling the coupling transducer and the input and the output transducers so that oscillations can be propagated between the input transducer and the output transducer via the coupling transducer. It is preferable that the acoustic coupling film 11 is made of a material with excellent insulation properties and having relatively smaller density and Young's module than those of the materials used for the films forming other layers. It is preferable that the acoustic coupling film 11 is made of materials adopted for semiconductor insulating films, such as, for example, organic polymer materials or SiO2. Other layers refer to the first piezoelectric film 12 and the second piezoelectric film 13.

An area E1 in which the upper electrode 1 and the lower electrode 2 oppose each other through the first piezoelectric film 12 is the input-side excitation portion (active area) of the FBAR. An area E2 in which the upper electrode 4 and the lower electrode 3 oppose each other through the first piezoelectric film 12 is an output-side excitation portion (active area) of the FBAR. An area E3 in which the upper electrode 5 and the lower electrode 3 oppose each other through the first piezoelectric film 12 is an output-side excitation portion (active area) of the FBAR. An acoustic wave excited at the excitation portion E1 is transmitted to, through the acoustic coupling film 11, the transducer part including the upper electrode 6, the second piezoelectric film 13, the lower electrode 8, and the like. Since the lower electrode 8 is electrically connected to a portion directly below the output terminal, the output-side excitation portions E2 and E3 can be excited, again through the acoustic coupling film 11. As shown in FIGS. 2A and 2C, the upper electrodes 4 and 5 are separated from each other, thus achieving a balanced output. It is possible to adjust the impedance by adjusting the areas of the excitation portions E1 to E3. For example, for the balanced filter shown in FIG. 2A, the input impedance and the output impedance can be adjusted by adjusting the area of the excitation portion E1 and the areas of the excitation portions E2 and E3, respectively.

Although the lower electrode 8 forming a pair with each of the upper electrodes 6 and 7 is a common electrode in this example as shown in FIG. 2B, electrodes arranged separately for the upper electrodes 6 and 7 may be used in place of the common electrode.

Further, by grounding the lower electrodes 2 and 3 and the upper electrodes 6 and 7, it is possible to reduce a stray capacitance between the input and the output sides and to ensure isolation with ease.

In the balanced filter shown in FIGS. 2A to 2C, impedance conversion as expressed by Eqs. (1) and (2) can be implemented. Further, the ratio between the input impedance and the output impedance can be changed by adjusting the areas of the excitation portions.

In this example, the substrate 9 having the cavity 10 is described as an example. It is to be noted that the substrate 9 may be configured to have an acoustic mirror structure in place of the cavity 10. Further, in this example, the filter having a cavity filter structure in which the substrate 9 has the cavity 10 is described as an example. It is to be noted that the filter may have an air gap filter structure in which an air gap is formed between the substrate 9 and the lower electrode 8.

Example 2

Figure 3:
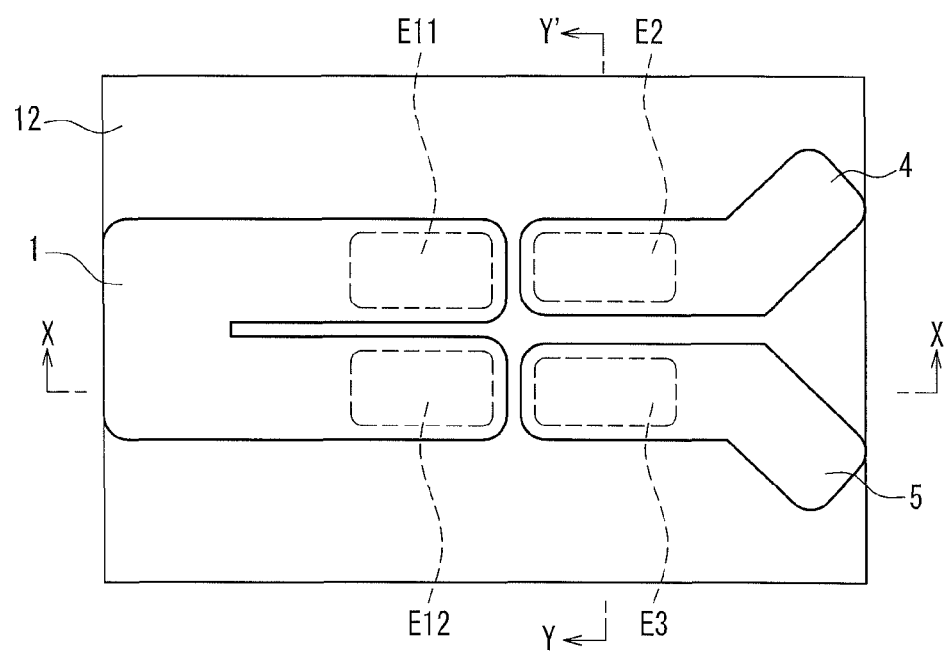
FIG. 3 is a plan view of a balanced filter of Example 2.

FIG. 3 is a plan view of a balanced filter of Example 2. In FIG. 3, the same components as those of the balanced filter shown in FIGS. 2A to 2C are denoted by the same reference numerals, and the detailed description thereof will not be repeated.

The balanced filter of Example 2 is different from the balanced filter of Example 1 in that the input-side excitation portion is divided into excitation portions E11 and E12, and the excitation portions E11 and E12 are connected to each other in parallel. This balanced filter operates in the same manner as the balanced filter of Example 1 and has the same cross-sectional structure as that of the balanced filter of Example 1.

In the balanced filter of Example 2, impedance conversion as expressed by Eqs. (1) and (2) can be implemented. That is, the input impedance Zin can be yield by substituting in Eq. (1) the impedance Z1 of the area of the upper electrode 1 forming the excitation portion E11 and the impedance Z2 of the area of the upper electrode 1 forming the excitation portion E12. Further, the output impedance Zout can be yield by substituting in Eq. (2) the impedance Z3 of the upper electrode 4 and the impedance Z4 of the upper electrode 5. The ratio between the input impedance and the output impedance can be essentially changed by adjusting the areas of the excitation portions.

Example 3

Figure 4A:
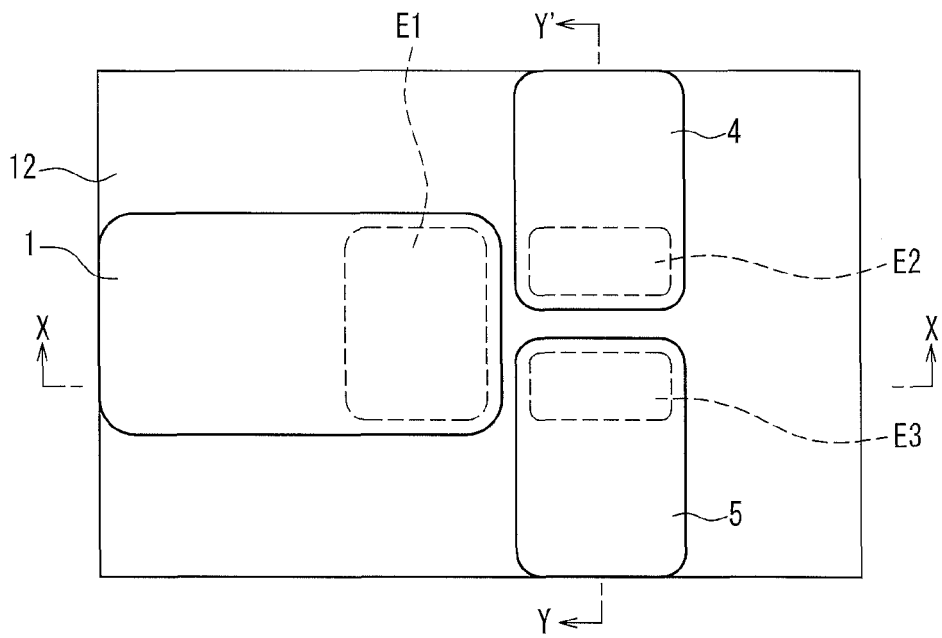
FIG. 4A is a plan view of a balanced filter of Example 3.
Figure 4B:
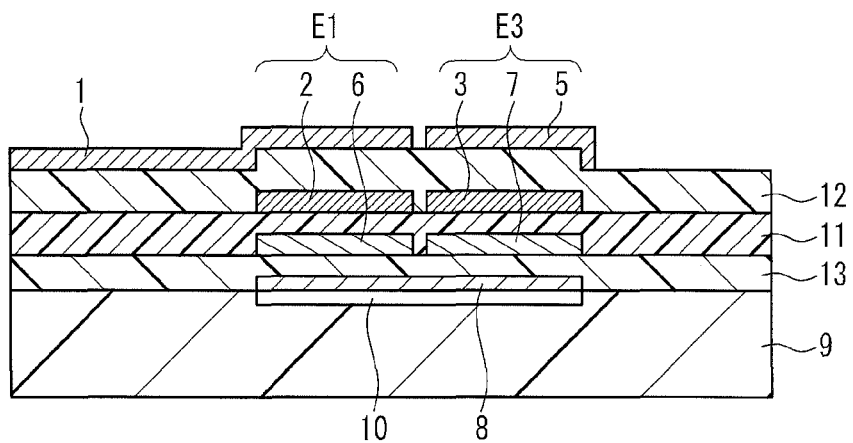
FIG. 4B is a cross-sectional view of the X-X portion in FIG. 4A.
Figure 4C:
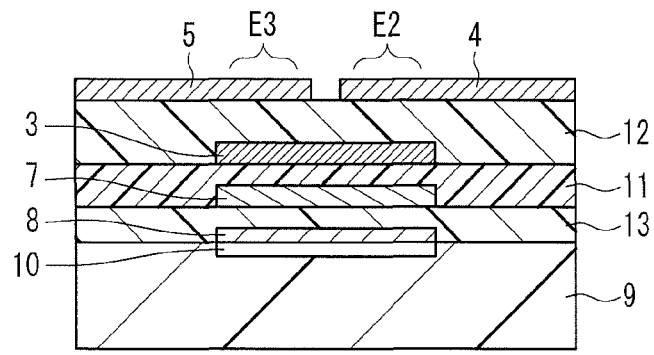
FIG. 4C is a cross-sectional view of the Y-Y portion in FIG. 4A.

FIG. 4A is a plan view of a balanced filter of Example 3. FIG. 4B is a cross-sectional view of the X-X portion in FIG. 4A. FIG. 4C is a cross-sectional view of the Y-Y portion in FIG. 4A. In FIG. 4A to 4C, the same components as those of the balanced filter shown in FIGS. 2A to 2C are denoted by the same reference numerals, and the detailed description thereof will not be repeated.

The balanced filter of Example 3 is different from the balanced filter of Example 1 in the way the upper electrodes 4 and 5 are arranged on the first piezoelectric film 12. In the balanced filter of Example 1, the upper electrodes 1, 4, and 5 are arranged such that the direction in which the upper electrode 1 extends becomes substantially the same as those of the upper electrodes 4 and 5 as shown in FIG. 2A. In contrast, in the balanced filter of Example 3, the direction in which the upper electrode 1 extends is substantially orthogonal to those of the upper electrodes 4 and 5 as shown in FIG. 4A. Note that the balanced filter operates in the same manner as the balanced filter of Example 1 and has the same basic cross-sectional structure as that of the balanced filter of Example 1.

Example 4

Figure 5A:
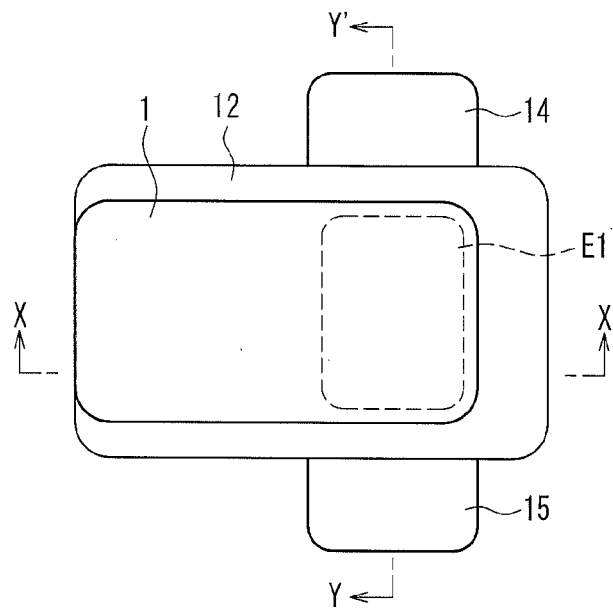
FIG. 5A is a plan view of a balanced filter of Example 4.
Figure 5B:
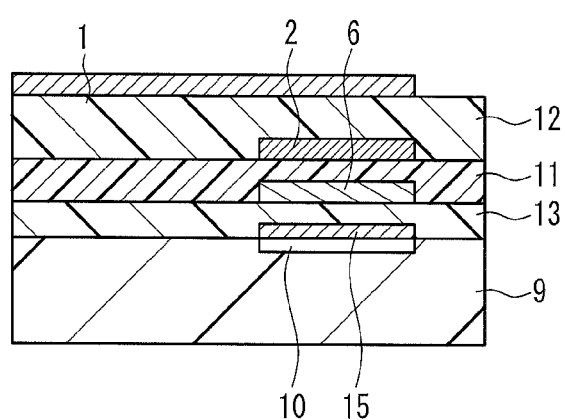
FIG. 5B is a cross-sectional view of the X-X portion in FIG. 5A.
Figure 5C:
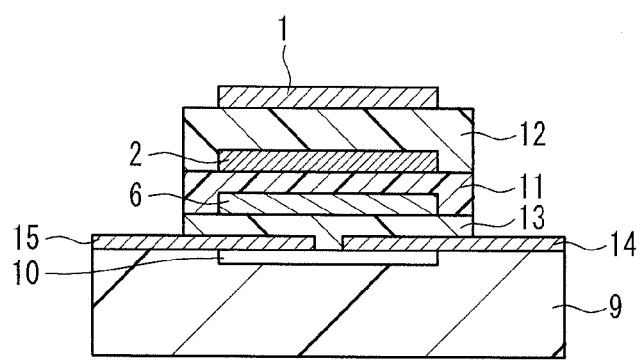
FIG. 5C is a cross-sectional view of the Y-Y portion in FIG. 5A.

FIG. 5A is a plan view of a balanced filter of Example 4. FIG. 5B is a cross-sectional view of the X-X portion in FIG. 5A. FIG. 5C is a cross-sectional view of the Y-Y portion in FIG. 5A.

As shown in FIGS. 5A to 5C, in the balanced filter of Example 4, upper electrodes 14 and 15, the second piezoelectric film 13, the upper electrode 6, the acoustic coupling film 11, the lower electrode 2, the first piezoelectric film 12 and the upper electrode 1 are laminated on the substrate 9 in this order. The upper electrodes 14 and 15 respectively correspond to the upper electrodes 4 and 5 described in Example 1, etc. The balanced filter of Example 4 is structured such that the upper electrode 1 to which electric signals are inputted and the upper electrodes 14 and 15 from which electric signals are outputted are laminated in the thickness direction.

An acoustic wave excited at the input-side excitation portion E1 (the area in which the upper electrode 1 and the lower electrode 2 oppose each other through the first piezoelectric film 12) is transmitted to, through the acoustic coupling film 11, an output transducer including the upper electrode 6, the second piezoelectric film 13, and the upper electrodes 14 and 15. The acoustic wave transmitted to the output transducer is again converted into electric signals, and the electric signals are outputted from the upper electrodes 14 and 15.

In the balanced filter of Example 4, since the upper electrodes 1, 14 and 15 are stacked in the thickness direction, the area taken up by the upper electrodes on the substrate 9 can be reduced. Thus, it is possible to reduce the size of the filter as a whole.

Further, in the balanced filter of Example 4, by grounding the lower electrode 2, it is possible to reduce a stray capacitance between the input and the output sides and to ensure isolation with ease.

In Example 4, the output transducer, the acoustic coupling film 11 and the input transducer are laminated on the substrate 9 in this order. It is to be noted that the input transducer, the acoustic coupling film 11, and the output transducer may be laminated on the substrate 9 in this order.

2. Method of Producing Balanced Filter

FIGS. 6A to 6G are cross-sectional views each showing a process of production of the balanced filter of Example 1. That is, FIGS. 6A to 6G are cross-sectional views each showing a process of production of a balanced filter having a cavity FBAR structure.

Figure 6A:
FIG. 6A is a cross-sectional view showing an example of a process of production of a balanced filter including a cavity FBAR.
Figure 6B:
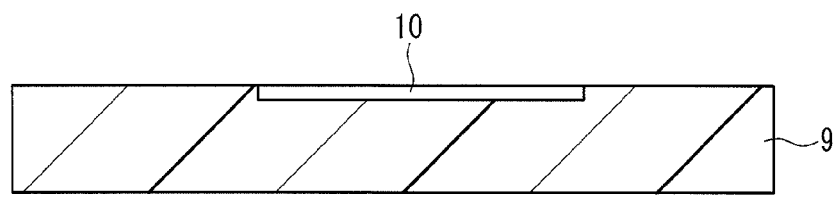
FIG. 6B is a cross-sectional view showing an example of the process of production of the balanced filter including a cavity FBAR.
Figure 6C:
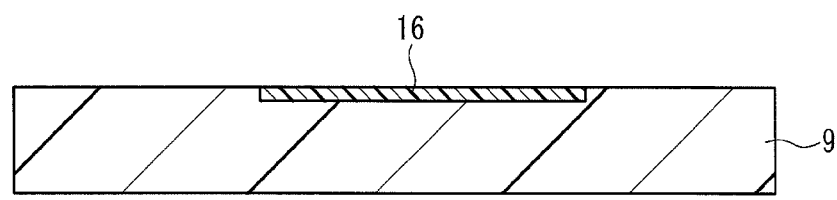
FIG. 6C is a cross-sectional view showing an example of the process of production of the balanced filter including a cavity FBAR.
Figure 6D:
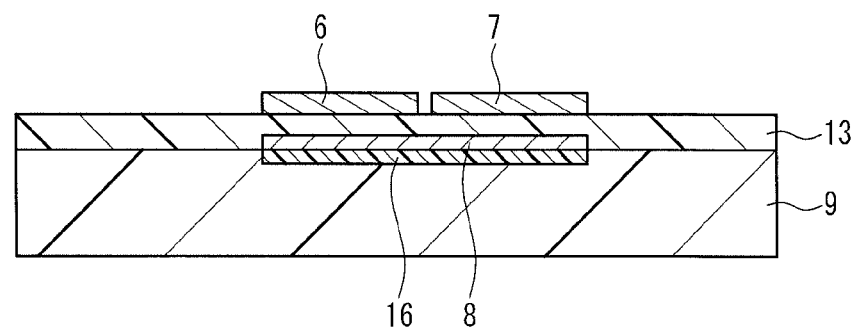
FIG. 6D is a cross-sectional view showing an example of the process of production of the balanced filter including a cavity FBAR.
Figure 6E:
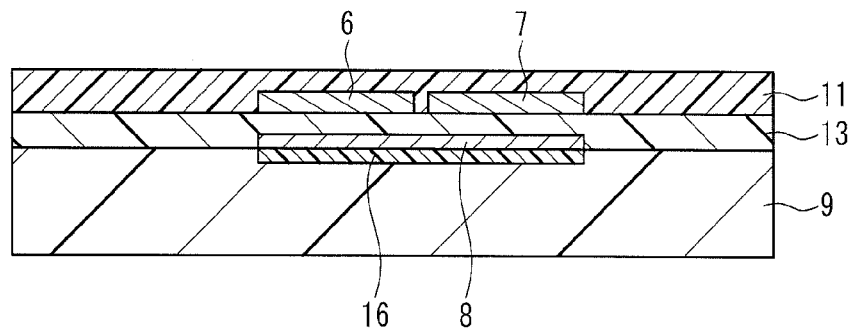
FIG. 6E is a cross-sectional view showing an example of the process of production of the balanced filter including a cavity FBAR.
Figure 6F:
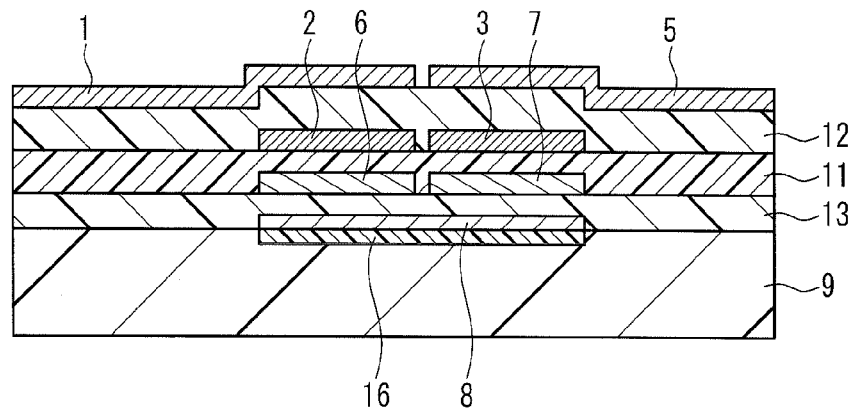
FIG. 6F is a cross-sectional view showing an example of the process of production of the balanced filter including a cavity FBAR.
Figure 6G:
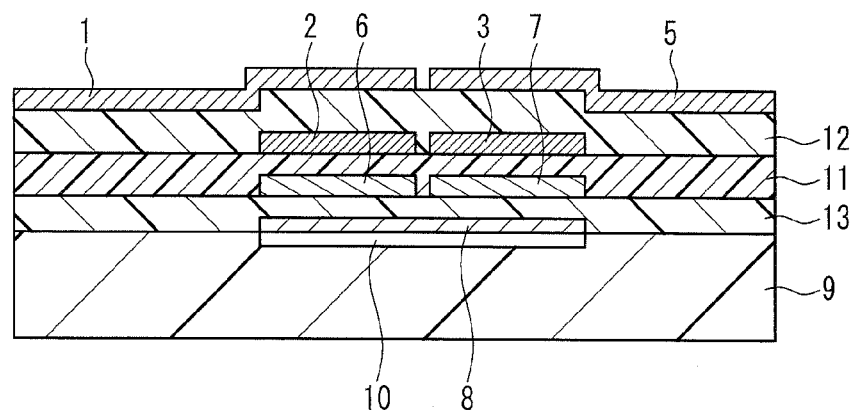
FIG. 6G is a cross-sectional view showing an example of the process of production of the balanced filter including a cavity FBAR.

First, as shown in FIG. 6A, the substrate 9 made of silicon is prepared. Next, as shown in FIG. 6B, the cavity 10 is formed in the surface of the substrate 9. The cavity 10 can be formed by, for example, dry etching. Then, as shown in FIG. 6C, a sacrificing layer 16 is formed in the cavity 10. Subsequently, as shown in FIG. 6D, the lower electrode 8, the second piezoelectric film 13, and the upper electrodes 6 and 7 are formed on the substrate 9 and the sacrificing layer 16 in this order. The upper electrodes 6 and 7 and the lower electrode 8 can be made of, for example, Ru. The second piezoelectric film 13 can be made of, for example, MN. Next, as shown in FIG. 6E, the acoustic coupling film 11 is formed on the upper electrodes 6 and 7 and the second piezoelectric film 13. The acoustic coupling film 11 can be made of, for example, silicon oxide (SiO2). Then, as shown in FIG. 6F, the lower electrodes 2 and 3, the first piezoelectric film 12 and the upper electrodes 1, 4 and 5 are formed on the acoustic coupling film 11. The upper electrodes 1, 4 and 5 and the lower electrodes 2 and 3 can be made of, for example, Ru. The first piezoelectric film 12 can be made of, for example, MN. Thereafter, as shown in FIG. 6G, the sacrificing layer 16 is removed by wet etching or the like to form the cavity 10. As a result of going though the above steps, the balanced filter of Example 1 can be produced.

FIGS. 7A to 7F are cross-sectional views each showing a process of production of a filter including air gap FBARs. Unlike a cavity FBAR whose substrate includes a cavity (concave portion), an air gap FBAR has an air gap between the substrate and an electrode formed on the substrate.

Figure 7A:
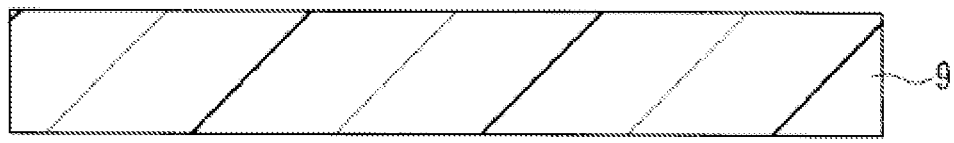
FIG. 7A is a cross-sectional view showing an example of a process of production of a balanced filter including an air gap FBAR.
Figure 7B:
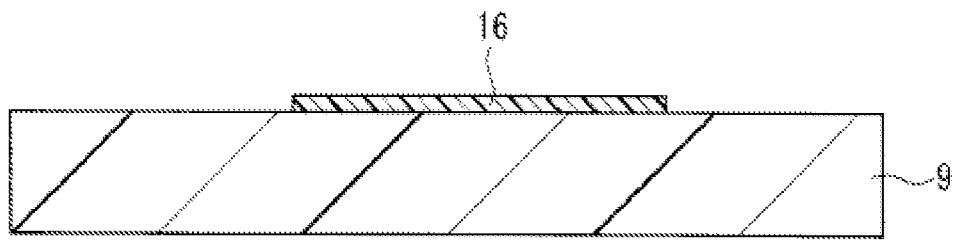
FIG. 7B is a cross-sectional view showing an example of the process of production of the balanced filter including an air gap FBAR.
Figure 7C:
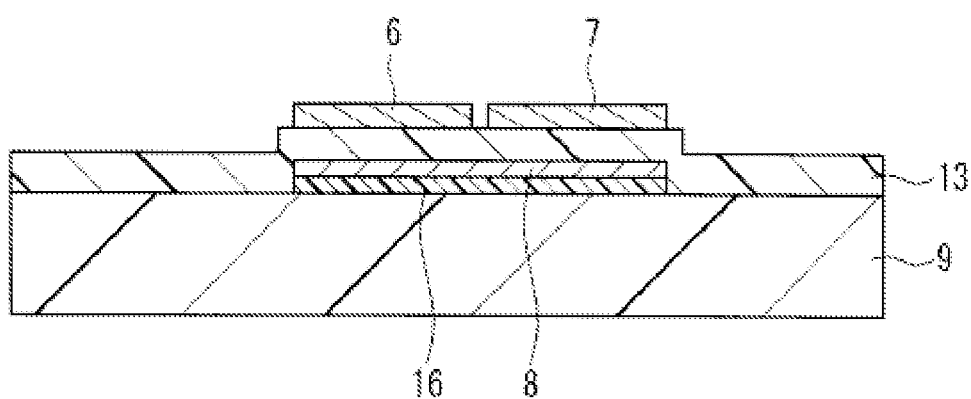
FIG. 7C is a cross-sectional view showing an example of the process of production of the balanced filter including an air gap FBAR.
Figure 7D:
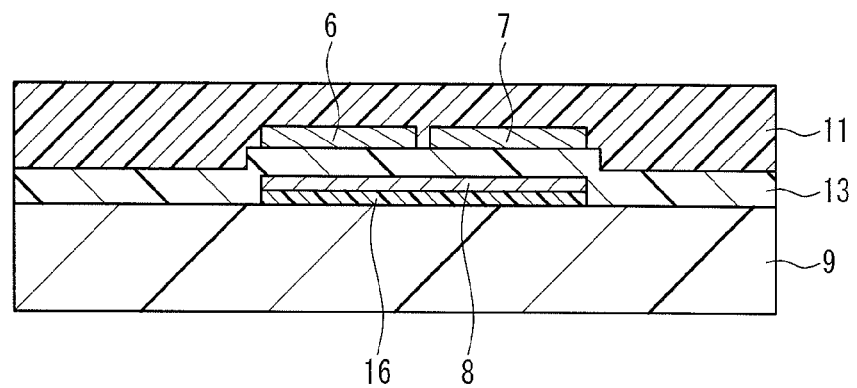
FIG. 7D is a cross-sectional view showing an example of the process of production of the balanced filter including an air gap FBAR.
Figure 7E:
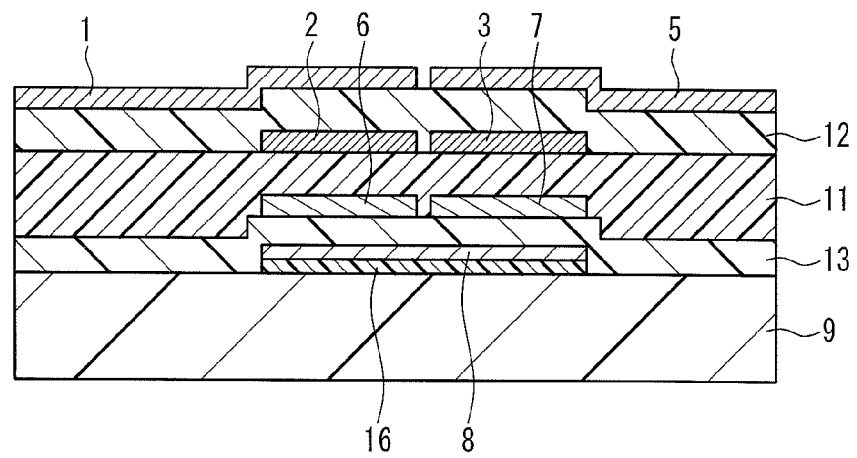
FIG. 7E is a cross-sectional view showing an example of the process of production of the balanced filter including an air gap FBAR.
Figure 7F:
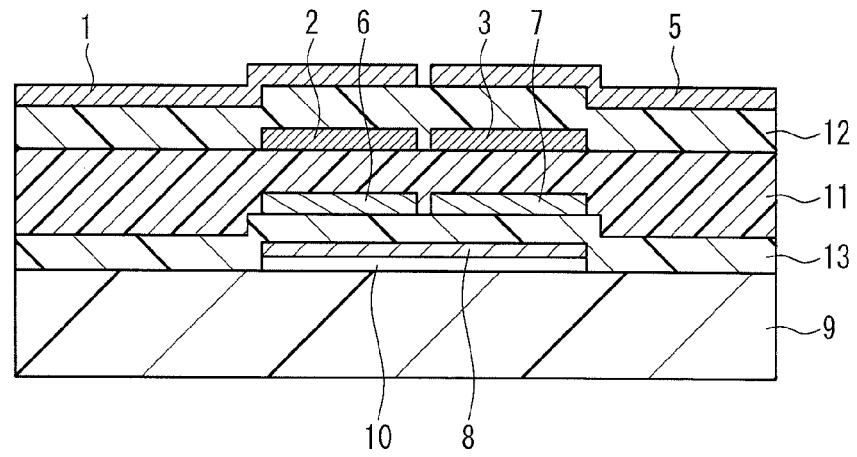
FIG. 7F is a cross-sectional view showing an example of the process of production of the balanced filter including an air gap FBAR.

First, as shown in FIG. 7A, the substrate 9 made of silicon is prepared. Next, as shown in FIG. 7B, the sacrificing layer 16 is formed on the surface of the substrate 9. Subsequently, as shown in FIG. 7C, the lower electrode 8, the second piezoelectric film 13, and the upper electrodes 6 and 7 are formed on the substrate 9 and the sacrificing layer 16 in this order. The upper electrodes 6 and 7 and the lower electrode 8 can be made of, for example, Ru. The second piezoelectric film 13 can be made of, for example, MN. Next, as shown in FIG. 7D, the acoustic coupling film 11 is formed on the upper electrodes 6 and 7 and the second piezoelectric film 13. The acoustic coupling film 11 can be made of, for example, silicon oxide (SiO2). Then, as shown in FIG. 7E, the lower electrodes 2 and 3, the first piezoelectric film 12 and the upper electrodes 1, 4 and 5 are formed on the acoustic coupling film 11. The upper electrodes 1, 4 and 5 and the lower electrodes 2 and 3 can be made of, for example, Ru. The first piezoelectric film 12 can be made of AlN, for example. Thereafter, as shown in FIG. 7F, the sacrificing layer 16 is removed by wet etching or the like to form an air gap 10. As a result of going though the above steps, a balanced filter having an air gap FBAR structure can be produced.

3. Configuration of Duplexer

Devices for mobile communications (high-frequency wireless communications) such as mobile phone terminals, PHS (personal handy-phone system) terminals and terminals for wireless LAN systems are equipped with duplexers. Duplexers are used in wireless devices having capability to transmit and receive communication radio waves or the like and transmit and receive signals of different frequencies.

Figure 8:
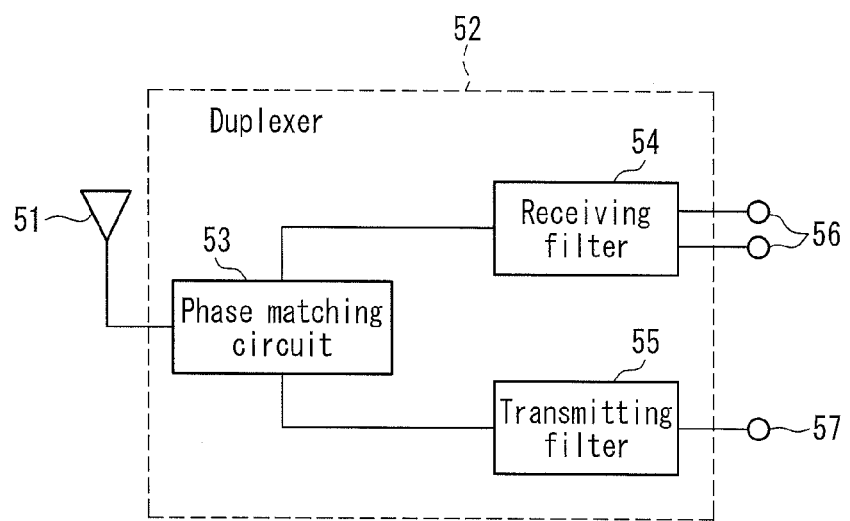
FIG. 8 is a block diagram of an example of a duplexer.

FIG. 8 shows a configuration of a duplexer including the balanced filter according to the present embodiment. The duplexer 52 includes a phase matching circuit 53, a receiving filter 54 and a transmitting filter 55. The phase matching circuit 53 is an element for phase-adjusting the impedance of the receiving filter 54 so as to prevent transmission signals outputted from the transmitting filter 55 from flowing into the receiving filter 54. An antenna 51 is connected to the phase matching circuit 53. The receiving filter 54 is composed of a band pass filter, though which, of reception signals inputted thereto through the antenna 51, only signals in a certain frequency band are allowed to pass. Further, output terminals 56 are connected to the receiving filter 54. The transmitting filter 55 is composed of a band pass filter, though which, of transmission signals inputted thereto through an input terminal 57, only signals in a certain frequency band are allowed to pass. Further, the input terminal 57 is connected to the transmitting filter 55. Here, the receiving filter 54 includes the balanced filter according to the present embodiment.

4. Configuration of Communication Module

Figure 9:
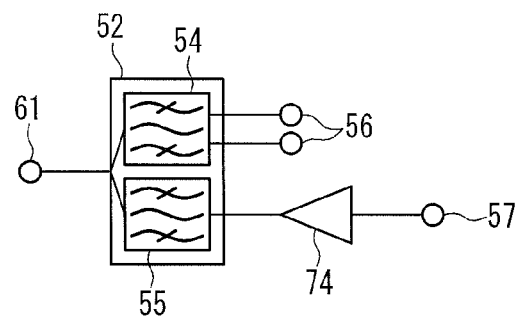
FIG. 9 is a block diagram of an example of a communication module.

FIG. 9 shows one example of a communication module including the duplexer according to the present embodiment. As shown in FIG. 9, the duplexer 52 includes the receiving filter 54 and the transmitting filter 55. Further, to the receiving filter 54, the receiving terminals 56 compatible with a balanced output are connected, for example. Further, the transmitting filter 55 is connected to the transmitting terminal 57 through a power amplifier 74. Here, the receiving filter 54 includes the balanced filter according to the present embodiment.

Of reception signals inputted to the receiving filter 54 through an antenna terminal 61, only signals in a certain frequency band are allowed to pass through during the reception operation, and are outputted externally from the receiving terminals 56. Further, of transmission signals inputted from the transmitting terminal 57 and amplified by the power amplifier 74, only signals in a certain frequency band are allowed to pass through the transmitting filter 55 during the transmission operation, and are outputted externally from the antenna terminal 61.

Note that the configuration of the communication module shown in FIG. 9 is merely an example. Even if the duplexer according to the present embodiment is incorporated into a communication module in other form, the same effects can be still achieved.

5. Configuration of Communication Device

Figure 10:
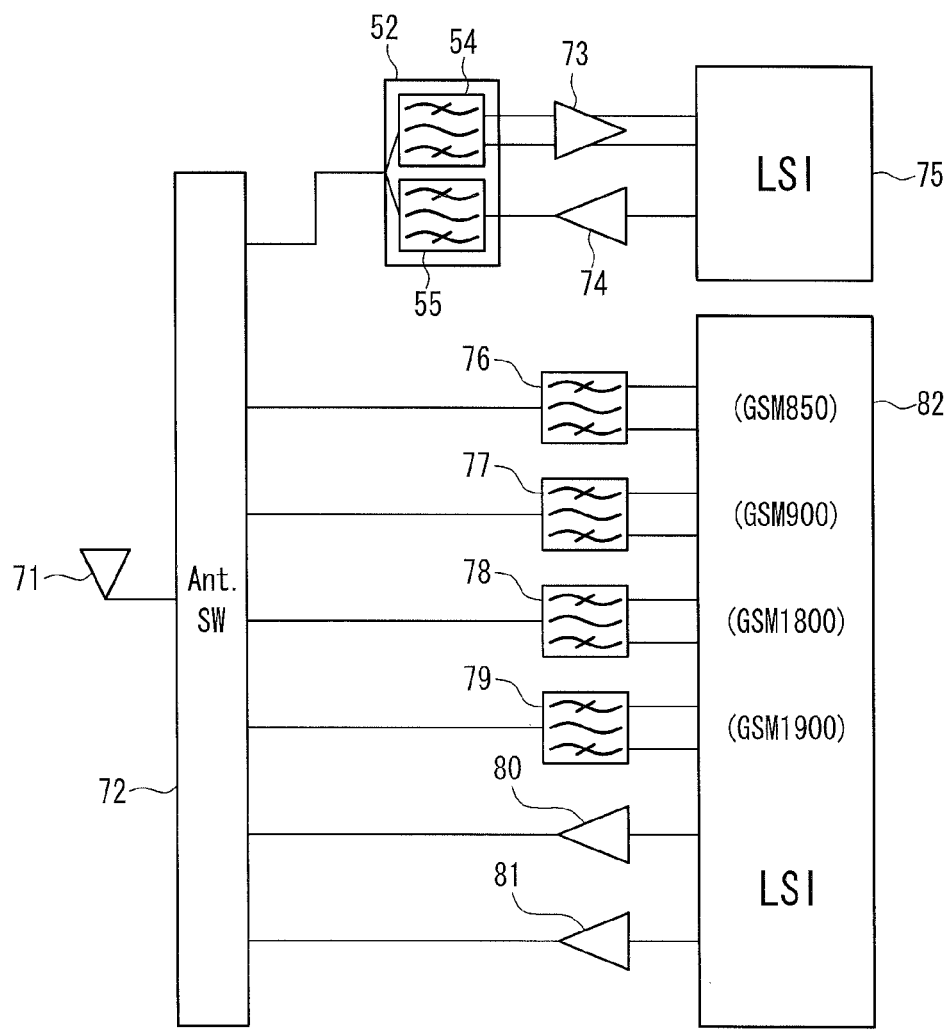
FIG. 10 is a block diagram of an example of a communication device.

FIG. 10 shows an RF block of a mobile phone terminal as one example of a communication device including the duplexer according to the present embodiment or the communication module as described above. The communication device whose configuration is shown in FIG. 10 can be used as a mobile phone terminal compatible with, for example, the GSM (Global System for Mobile Communications) communication system and the W-CDMA (Wideband Code Division Multiple Access) communication system. The GSM communication system in the present embodiment supports 850 MHz, 950 MHz, 1.8 GHz and 1.9 GHz bands. In addition to the components shown in FIG. 10, the mobile phone terminal also includes a microphone, a speaker, a liquid crystal display and the like but these components are not illustrated because they are irrelevant to the description of the present embodiment. Here, the receiving filter 54 of the duplexer 52 includes the balanced filter according to the present embodiment.

First, an antenna switching circuit 72 selects an LSI to be operated based on the communication system of reception signals inputted thereto through an antenna 71, i.e., based on whether the communication system is W-CDMA or GSM. When the inputted reception signals correspond to the W-CDMA communication system, switching is performed to output the reception signals to the duplexer 52. The reception signals inputted to the duplexer 52 are limited to those in a certain frequency band through the receiving filter 54, so that balanced reception signals are outputted to a LNA 73. The LNA 73 amplifies the inputted reception signals and outputs the amplified reception signals to an LSI 75. Based on the inputted reception signals, the LSI 75 decodes the signals into audio signals and controls the operation of each portion of the mobile phone terminal.

On the other hand, when transmitting signals, the LSI 75 produces transmission signals. The transmission signals produced are amplified by the power amplifier 74 and are inputted to the transmitting filter 55. Of the transmission signals inputted to the transmitting filter 55, only signals in a certain frequency band are allowed to pass therethrough. The transmission signals outputted from the transmitting filter 55 are outputted externally from the antenna 71 through the antenna switching circuit 72.

Further, when the inputted reception signals are signals corresponding to the GSM communication system, the antenna switching circuit 72 selects one of receiving filters 76 to 79 based on the frequency bands of the signals, and outputs the reception signals to the selected receiving filter. The reception signals limited by one of the receiving filters 76 to 79 to a certain frequency band are inputted to an LSI 82. Based on the inputted reception signals, the LSI 82 decodes the signals into audio signals and controls the operation of each portion of the mobile phone terminal. On the other hand, when transmitting signals, the LSI 82 produces transmission signals. The transmission signals produced are amplified by a power amplifier 80 or 81 and are outputted externally from the antenna 71 through the antenna switching circuit 72.

Note that the configuration of the communication device shown in FIG. 10 is merely an example. Even if the duplexer according to the present embodiment is incorporated into a communication device in other form, the same effects can be still achieved.

6. Effects of Embodiment, etc.

According to the present embodiment, it is possible to achieve a high Q filter by achieving, with use of FBARs, a filter in which unbalanced to balanced conversion is implemented.

Further, the impedance can be adjusted by adjusting the area of the excitation portion of the input transducer and the area of the excitation portion of the output transducer.

Note that the transducer composed of the upper electrode 1, the lower electrode 2 and the first piezoelectric film 12 in the present embodiment is one example of the primary transducer of the present invention. The transducer composed of the upper electrodes 4 and 5, the lower electrode 3 and the first piezoelectric film 12 in the present embodiment is one example of the secondary transducer of the present invention. The transducer composed of the upper electrodes 6 and 7, and the second piezoelectric film 13 in the present embodiment is one example of the coupling transducer of the present invention.

The present application is useful for a filter, a duplexer, a communication module and a communication device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. A filter comprising:
   a primary transducer connected to a primary terminal;
   a secondary transducer connected to a plurality of secondary terminals; and
   a coupling transducer for mechanically coupling the primary transducer and the secondary transducer,
   wherein each of the primary transducer, the secondary transducer, and the coupling transducer comprises an upper electrode, a lower electrode arranged below the upper electrode, and a piezoelectric film interposed between the upper electrode and the lower electrode,
   wherein the primary transducer and the secondary transducer are arranged on the upper electrode of the coupling transducer,
   wherein the lower electrode of the primary transducer, the lower electrode of the secondary transducer, and the upper electrode of the coupling transducer are grounded,
   wherein the primary transducer includes two top electrodes connected in parallel to the primary terminal,
   wherein the secondary transducer includes a plurality of top electrodes respectively connected to the plurality of secondary terminals,
   wherein the primary transducer includes two excitation portions,
   wherein the secondary transducer includes a plurality of excitation portions, and
   wherein, with respect to the primary transducer and the secondary transducer, respective areas of the two excitation portions and respective areas of the plurality of excitation portions are equal to one another.

2. The filter according to claim 1, wherein the filter comprises a coupling layer between the coupling transducer and the primary transducer and between the coupling transducer and the secondary transducer.

3. The filter according to claim 1, wherein at least one of the two excitation portions of the primary transducer and at least one of the plurality of excitation portions of the secondary transducer are different in area.

4. A duplexer comprising a primary filter and a secondary filter,
   wherein at least one of the primary filter and the secondary filter is a filter according to claim 1.

5. A communication module comprising a primary filter and a secondary filter,
   wherein at least one of the primary filter and the secondary filter is a filter according to claim 1.

6. A communication device comprising a primary filter and a secondary filter, wherein at least one of the primary filter and the secondary filter is a filter according to claim 1.

7. A filter comprising:
a primary transducer connected to a primary terminal;
a plurality of secondary transducers connected respectively to a plurality of secondary terminals; and
a coupling layer provided between the primary transducer and the plurality of secondary transducers,
wherein one side of the coupling layer is bonded to the primary transducer and the other side of the coupling layer is bonded to the plurality of secondary transducers,
wherein the primary transducer includes a top electrode connected to the primary terminal,
wherein the plurality of secondary transducers each include an upper electrode connected to the secondary terminal corresponding thereto,
wherein the primary transducer includes an excitation portion,
wherein the plurality of secondary transducers each include an excitation portion, and
wherein an area of the excitation portion of the primary transducer is greater than a total area of the excitation portions of the respective secondary transducers.

8. A duplexer comprising a primary filter and a secondary filter,
wherein at least one of the primary filter and the secondary filter is a filter according to claim 7.

9. A communication module comprising a primary filter and a secondary filter,
wherein at least one of the primary filter and the secondary filter is a filter according to claim 7.

10. A communication device comprising a primary filter and a secondary filter,
wherein at least one of the primary filter and the secondary filter is a filter according to claim 7.

11. A filter comprising:
a primary transducer connected to a primary terminal;
a plurality of secondary transducers connected respectively to a plurality of secondary terminals; and
a coupling layer for mechanically coupling the primary transducer and the plurality of secondary transducers,
wherein the primary transducer includes an upper electrode connected to the primary terminal,
wherein the plurality of secondary transducers each include an upper electrode connected to the secondary terminal corresponding thereto,
wherein the primary transducer includes an excitation portion,
wherein the plurality of secondary transducers each include an excitation portion,
wherein an area of the excitation portion of the primary transducer is greater than a total area of the excitation portions of the respective secondary transducers.

12. A duplexer comprising a primary filter and a secondary filter,
wherein at least one of the primary filter and the secondary filter is a filter according to claim 11.

13. A communication module comprising a primary filter and a secondary filter,
wherein at least one of the primary filter and the secondary filter is a filter according to claim 11.

14. A communication device comprising a primary filter and a secondary filter,
wherein at least one of the primary filter and the secondary filter is a filter according to claim 11.

* * * * *